United States Patent [19]
Kim et al.

[11] Patent Number: 5,972,161
[45] Date of Patent: Oct. 26, 1999

[54] DRY ETCHER APPARATUS FOR PREVENTING RESIDUAL REACTION GAS FROM CONDENSING ON WAFERS AFTER ETCHING

[75] Inventors: Tae-Wook Kim, Suwon; Su-Kwang Noh, Seoul; Jin-Ho Park, Suwon, all of Rep. of Korea

[73] Assignee: Samsung Electronics Co., Ltd., Suwon-city, Rep. of Korea

[21] Appl. No.: 08/840,237

[22] Filed: Apr. 11, 1997

[30] Foreign Application Priority Data

May 30, 1996 [KR] Rep. of Korea ...................... 96-18825

[51] Int. Cl.⁶ ........................................................ C23F 1/02
[52] U.S. Cl. ............................. 156/345; 118/719; 134/1.1
[58] Field of Search ................................... 118/719, 50.1, 118/723 R, 724; 134/1.1; 156/345; 204/298.25, 298.35

[56] References Cited

U.S. PATENT DOCUMENTS

| | | |
|---|---|---|
| 5,240,556 | 8/1993 | Ishikawa et al. ........................ 156/643 |
| 5,344,525 | 9/1994 | Cathey, Jr. ............................... 156/643 |
| 5,554,563 | 9/1996 | Chu et al. ................................ 437/190 |
| 5,670,421 | 9/1997 | Nishitani et al. ....................... 437/192 |
| 5,830,279 | 11/1998 | Hackenberg ............................ 134/1.1 |

*Primary Examiner*—Bruce Breneman
*Assistant Examiner*—Luz Alejandro
*Attorney, Agent, or Firm*—Jones Volentine, LLP

[57] ABSTRACT

A dry etcher for etching a thin film on a wafer, includes an etching chamber having the wafer loaded therein and a supply system for supplying a reaction gas to the etching chamber to etch the thin film on the wafer. A loadlock chamber controls an etching atmosphere before and after the wafer is loaded in and unloaded from the etching chamber. A pumping device pumps the reaction gas out of the etching chamber and the loadlock chamber after the thin film is etched. A heater or cleaning device prevents any residual reaction gas remaining in the etching chamber and loadlock chamber from condensing on the wafer when the wafer is exposed to ambient atmosphere after exiting the loadlock chamber. The heater or cleaning device may be disposed in the etching chamber or the loadlock chamber.

4 Claims, 3 Drawing Sheets

DRY ETCHER APPARATUS FOR PREVENTING RESIDUAL REACTION GAS FROM CONDENSING ON WAFERS AFTER ETCHING

FIELD OF THE INVENTION

The present invention relates to a dry etcher for etching semiconductor devices, and more particularly, to a dry etcher and method of preventing the reaction gas remaining on a wafer after the wafer is etched from being condensed on the wafer, without having to resort to a separate device or a separate treatment method.

BACKGROUND OF THE INVENTION

An etcher is an apparatus used in manufacturing semiconductor devices, which, according to the object of the process, selectively eliminates various thin films such as silicon film, polysilicon film, and silicon oxide film, formed under a photoresist film. The etching may be classified as wet etching using chemicals or dry etching using gas. The etcher apparatus would thus be referred to as a wet etcher or a dry etcher.

FIG. 1 schematically shows the construction of a conventional dry etcher. Referring to FIG. 1, the conventional dry etcher includes a wafer carrier 4, an etching chamber 5, loadlock chambers 6, and a gas discharger 7.

The wafer carrier 4 loads wafers 2 from a wafer cassette 1 and carries the wafers 2 via a conveyer 3 into the loadlock chamber 6. A reaction gas is input into the etching chamber 5, in which a high degree of vacuum is maintained. The loadlock chambers 6 are interconnected to the etching chamber 5 through entrances 5a and 5b. The loadlock chambers 6 are at approximately the same environment as that in the etching chamber 5.

The gas discharger 7 pumps/purges out the reaction gas remaining in the loadlock chamber 6 and etching chamber 5 after the etching process is completed, so as to maintain the high degree of vacuum in the loadlock chamber 6 and etching chamber 5.

When etching polysilicon films and the like by means of the dry etcher as described above, $Cl_2$, HBr, or the like is usually used as the reaction gas. Such gases exhibit a strong tendency to condense when they are exposed to an atmospheric state. Although, the gas discharger 7 seeks to pump/purge out the reaction gas remaining in the loadlock chamber 6 and etching chamber 5 after the etching process, some portion of the reaction gas still remains that is condensed and liquified on the wafers. The wafers containing the liquified gas are then subjected to the succeeding manufacturing process.

However, such condensed and liquified gas on the wafers must be eliminated because it can degrade the quality of the semiconductor as well as cause downstream manufacturing process problems. Generally, a separate device or a separate process is employed to eliminate the condensed and liquified gas. Such separate devices or processes, however, cause delays in the manufacturing process and increase the cost of manufacturing a semiconductor device.

In light of the foregoing, there exists a need for an etcher and method of preventing gas remaining on a wafer after the wafer is etched from being condensed on the wafer, without having to resort to a separate device or a separate treatment method.

SUMMARY OF THE INVENTION

The present invention overcomes one or more of the above described problems of the prior art. Accordingly, it is an object of the present invention to provide a dry etcher that prevents the reaction gas remaining on a wafer after the etching process from condensing on the wafer, without having to employ a separate device or a separate treatment method.

It is another object of the present invention to provide a method for dry etching a wafer, which prevents the reaction gas remaining on a wafer after the etching process from condensing on the wafer, without having to employ a separate device or a separate treatment method.

To achieve these and other objects, the dry etcher of the present invention comprises an etching chamber, a loadlock chamber, and a means for preventing residual reaction gas from being condensed on the wafer. More specifically, the dry etcher comprises an etching chamber having a wafer loaded therein; a supply means for supplying a reaction gas to the etching chamber to etch a thin film on the wafer; a loadlock chamber for controlling an etching atmosphere before and after the wafer is loaded in and unloaded from the etching chamber; means for pumping the reaction gas out of the etching chamber and the loadlock chamber after the thin film is etched; and means for preventing any residual reaction gas remaining in the etching chamber and loadlock chamber from being condensed on the wafer when the wafer is exposed to ambient atmosphere after exiting the loadlock chamber.

Preferably, the means for preventing any residual reaction gas from being condensed is a heater or a cleaner disposed in the etching chamber or the loadlock chamber. This residual reaction gas remaining on the wafer is then pumped out of the etching chamber and the loadlock chamber.

In another aspect, there is provided a dry etching method for preventing residual reaction gas from condensing on a wafer etched by a dry etcher, the dry etcher having an etching chamber and a loadlock chamber, the method comprising the steps of: (a) loading a wafer in the etching chamber; (b) supplying a reaction gas into the etching chamber while maintaining a high degree of vacuum in the etching chamber and the loadlock chamber; (c) etching the wafer in the etching chamber; (d) discharging the reaction gas out of the etching chamber and the loadlock chamber; and (e) heating a residual reaction gas simultaneously with step (d) so as to activate any residual reaction gas remaining on the wafer after the wafer is etched, thereby preventing the residual reaction gas from condensing on the wafer when exposed to an ambient atmosphere when the wafer is unloaded from the loadlock chamber after being etched.

BRIEF DESCRIPTION OF THE DRAWINGS

The above objects, and other features and advantages of the present invention will become more apparent by describing in detail preferred embodiments thereof with reference to the attached drawings, in which.

DETAILED DESCRIPTION OF PREFERRED EMBODIMENTS

Figure 1:
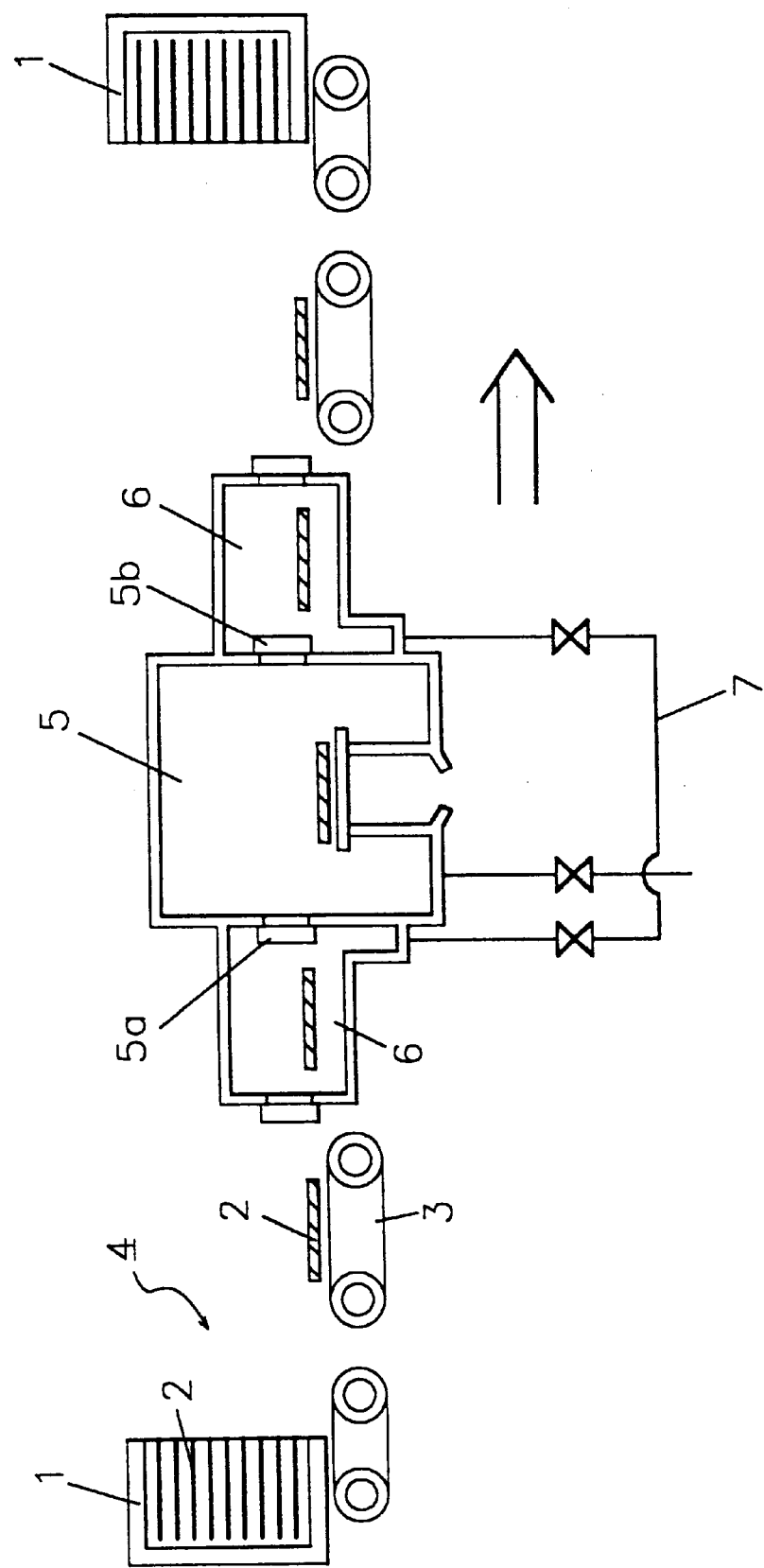
FIG. 1 is a schematic constructional view of a conventional dry etcher.

Several preferred embodiments of the present invention will be described in detail with reference to the accompanying drawings hereinafter, with like elements being referred to by like reference numerals.

FIGS. 2 through 5 are four schematic constructional views of dry etchers for eliminating residual reaction gas remaining on a wafer according to the first through fourth embodiments of the present invention.

Figure 2:
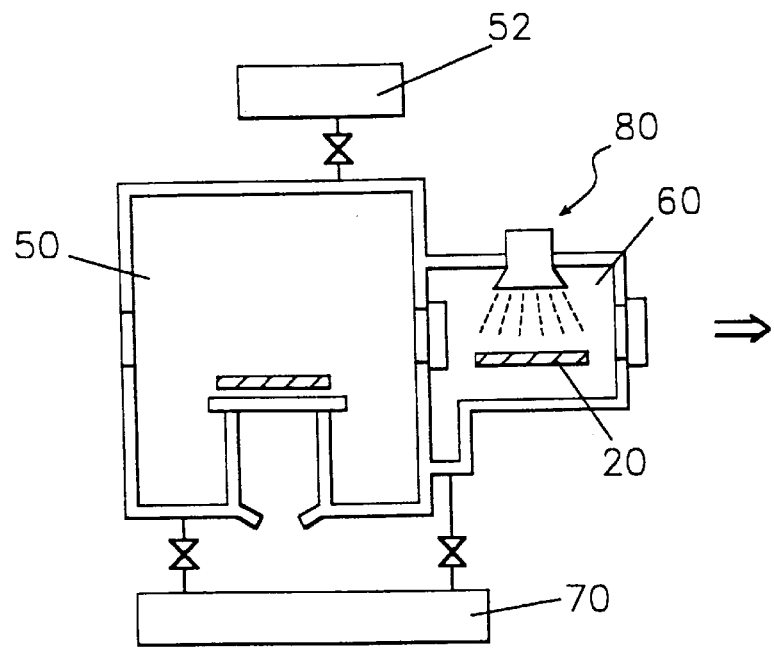
FIG. 2 is a schematic constructional view of a dry etcher for eliminating residual reaction gas remaining on a wafer according to a first embodiment of the present invention.

Referring to FIG. 2, the dry etcher includes an etching chamber 50 under a high degree of vacuum in which a wafer 20 is loaded by a carrier (not shown) and etched. A loadlock chamber 60 controls the etching environment before and after the wafer is loaded in and unloaded from the etching chamber 50 by maintaining a high degree of vacuum nearly equal to that in the etching chamber 50. A gas supplier 52 is connected to the etching chamber 50 and supplies a reaction gas thereto such as, for example, $Cl_2$ or HBr.

A gas discharger 70, respectively connected to the etching chamber 50 and the loadlock chamber 60, pumps/purges out the reaction gas in the loadlock chamber 60 and the etching chamber 50 after the etching process is completed, so as to maintain the high degree of vacuum in the loadlock chamber 60 and the etching chamber 50.

The dry etcher also includes a means for preventing any residual reaction gas remaining on the wafer from condensing. Specifically, a heater 80, such as an ultraviolet ray lamp or a halogen lamp, is disposed in the loadlock chamber 60. The heater 80 heats the residual reaction gas remaining therein by means of light energy to thereby activate the remaining gas so that the remaining gas on the wafer 20 does not condense when exposed to the atmosphere.

Figure 3:
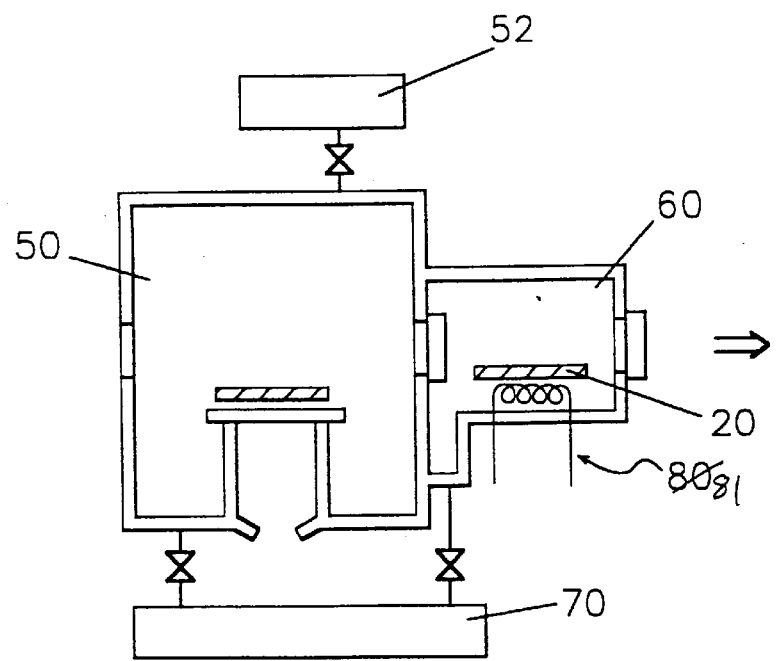
FIG. 3 is a schematic constructional view of a dry etcher for eliminating residual reaction gas remaining on a wafer according to a second embodiment of the present invention.

In a second embodiment of the present invention as shown in FIG. 3, the means for preventing any residual reaction gas remaining on the wafer from condensing is an electric heater 81 that heats the residual gas in the loadlock chamber 60 by electric energy instead of the light energy as in the first embodiment. In FIGS. 2 and 3, the remaining reference numerals refer to the same or like parts.

Figure 4:
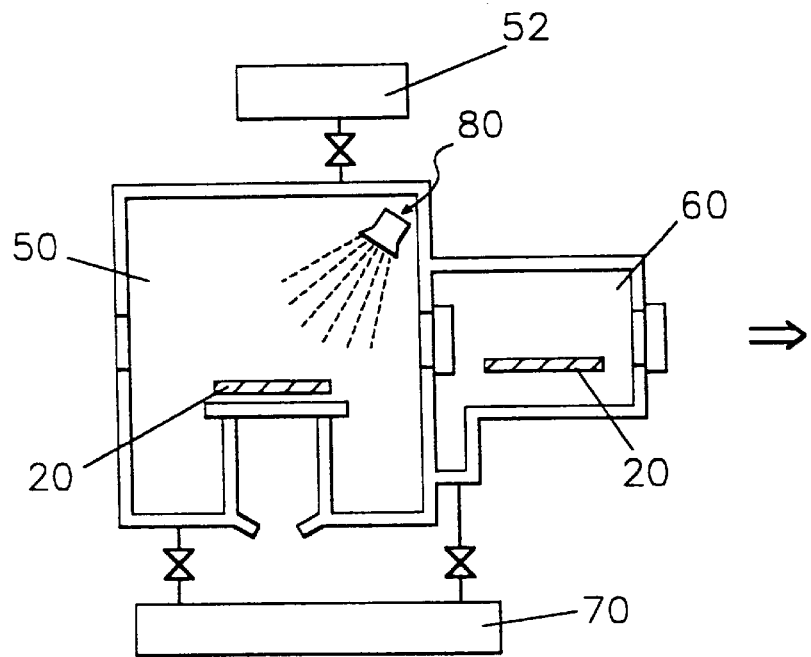
FIG. 4 is a schematic constructional view of a dry etcher for eliminating residual reaction gas remaining on a wafer according to a third embodiment of the present invention.

In a third embodiment of the present invention as shown in FIG. 4, the heater 80, such as an ultraviolet rays lamp or a halogen lamp, is disposed directly in the etching chamber 50 instead of the loadlock chamber 60 as in the first embodiment. The heater 80 heats any residual gas remaining in the etching chamber 50.

Figure 5:
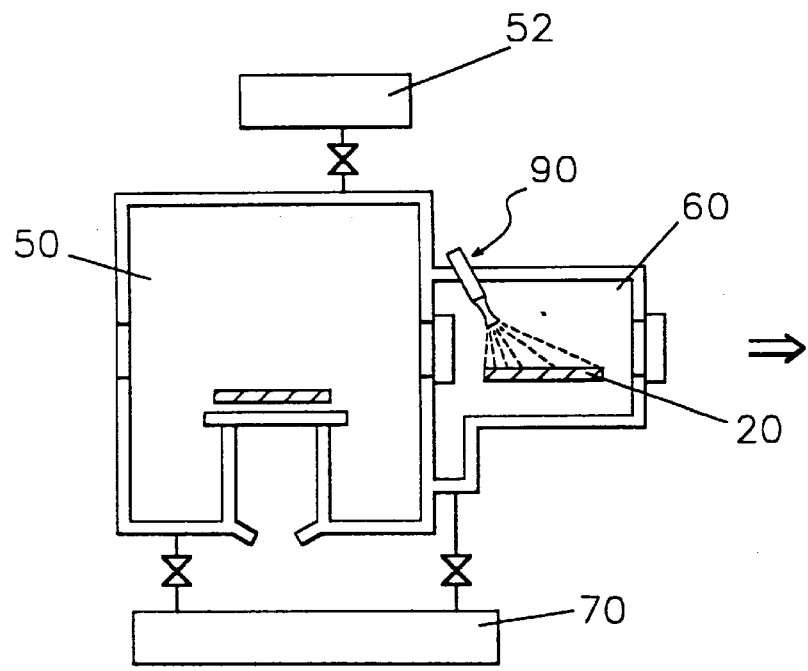
FIG. 5 is a schematic constructional view of a dry etcher for eliminating residual reaction gas remaining on a wafer according to a fourth embodiment of the present invention.

According to a fourth embodiment of the present invention as shown in FIG. 5, a cleaner 90 is disposed in the loadlock chamber 60 instead of the heaters 80 or 81 as set forth in the first and second embodiments. The cleaner 90 cleans the wafer 20 by means of deionized water.

In each of the various dry etcher embodiments of the present invention as described above, the wafer 20 is carried by the carrier (not shown) and loaded in the etching chamber 50. Thereafter, the wafer 20 is etched under a high degree of vacuum by reacting with the reaction gas supplied from the gas supplier 52 into the etching chamber 50.

Thereafter, the gas discharger 70 pumps/purges out the reaction gas remaining in the loadlock chamber 60 and the etching chamber 50 after the etching process. In this case, the heaters 80 or 81, disposed in either the loadlock chamber 60 or the etching chamber 50, heat any residual gas remaining in the chambers to thereby activate molecular movement of the gas. Likewise, this same result is achieved when the wafer 20 is cleaned by the cleaner 90 instead of being heated by the heaters 80 or 81. Therefore, the remaining gas does not condense on the wafer 20 even when the wafer 20 is exposed to the atmosphere after exiting the loadlock chamber 60.

As described above, in the dry etcher according to the present invention, the remaining gas does not condense on the wafer when it is exposed to the atmosphere after the etching process. Therefore, the dry etcher according to the present invention does not require a separate device to eliminate the remaining gas, thereby improving the yield of the manufactured semiconductor devices.

Further, since the present invention does not require a separate device to eliminate the remaining gas, it is very effective in improving a semiconductor manufacturing system, in particular, a manufacturing system that employs multi-functional chambers. Multi-functional chambers are chambers whose functions are diversified as the wafers become larger and more highly integrated.

In the drawings and specification, there have been disclosed typical preferred embodiments of the invention and, although specific terms are employed, they are used in a generic and descriptive sense only and not for purposes of limitation, it being understood that the scope of the present invention is set forth in the following claims and their equivalents.

What is claimed is:

1. A dry etcher for etching a thin film on a wafer, the dry etcher comprising:

an etching chamber having the wafer loaded therein;

a supply means for supplying a reaction gas to said etching chamber to etch the thin film on the wafer;

a loadlock chamber for controlling an etching atmosphere before and after the wafer is loaded in and unloaded from the etching chamber;

means for pumping the reaction gas, including any residual reaction gas remaining in the etching chamber and the loadlock chamber, out of the etching chamber and the loadlock chamber after the thin film is etched; and means, disposed in the loadlock chamber, for preventing the residual reaction gas remaining in the etching chamber and the loadlock chamber from being condensed on the wafer when the wafer is exposed to ambient atmosphere after exiting the loadlock chamber, wherein the means for preventing comprises a cleaner for cleaning the wafer in the loadlock chamber, thereby eliminating the residual reaction gas from the wafer.

2. A dry etcher as claimed in claim 1, wherein the cleaner uses deionized water to clean the wafer.

3. A dry etcher for etching a thin film on a wafer, the dry etcher comprising:

an etching chamber having the wafer loaded therein;

a supply means for supplying a reaction gas to said etching chamber to etch the thin film on the wafer;

a loadlock chamber for controlling an etching atmosphere before and after the wafer is loaded in and unloaded from the etching chamber;

means for pumping the reaction gas, including any residual reaction gas remaining in the etching chamber and the loadlock chamber, out of the etching chamber and the loadlock chamber after the thin film is etched; and means, disposed in the etching chamber, for preventing the residual reaction gas remaining in the etching chamber and the loadlock chamber from being condensed on the wafer when the wafer is exposed to ambient atmosphere after exiting the loadlock chamber, wherein the means for preventing comprises a cleaner for cleaning the wafer in the reaction chamber, thereby eliminating the residual gas from the wafer.

4. A dry etcher as claimed in claim 3, wherein the cleaner uses deionized water to clean the wafer.

* * * * *